United States Patent [19]

Chang et al.

[11] Patent Number: 5,858,588

[45] Date of Patent: Jan. 12, 1999

[54] METHOD FOR RECOVERING ALIGNMENT MARKS AFTER CHEMICAL MECHANICAL POLISHING

[75] Inventors: Jui-Yu Chang, Tao Yuan; Chunshing Chen, Chang-Hwa; Syun-Ming Jang, Hsin-chu; Ying-Ho Chen, Taipei, all of Taiwan

[73] Assignee: Taiwan Semiconductor Manufacturing Company, Ltd., Hsin-Chu, Taiwan

[21] Appl. No.: 850,133

[22] Filed: May 1, 1997

[51] Int. Cl.$^6$ .................................................. G03F 9/00
[52] U.S. Cl. ........................ 430/22; 430/312; 430/314; 430/316; 430/318
[58] Field of Search .............................. 430/22, 312, 314, 430/316, 318

[56] References Cited

U.S. PATENT DOCUMENTS 4,768,883  9/1988  Waldo et al. ............................ 356/399
5,271,798  12/1993  Sandhu et al. ......................... 438/745

*Primary Examiner*—Christopher G. Young
*Attorney, Agent, or Firm*—George O. Saile; Stephen B. Ackerman; Larry J. Prescott

[57] ABSTRACT

A mask pattern and method are described for the recovery of alignment marks on an integrated circuit wafer without the use of additional masks. The mask pattern and method provide means to recover the alignment marks after forming a metal layer on a planarized inter-level dielectric layer. The pattern which conventional methods have placed on a separate mask is formed in the end regions of a mask used for forming a pattern on the active region of the wafer. In order to fit the pattern in the end regions of the mask the pattern is divided into two parts. When the pattern is used to expose a layer of photoresist two exposure steps are used.

9 Claims, 12 Drawing Sheets

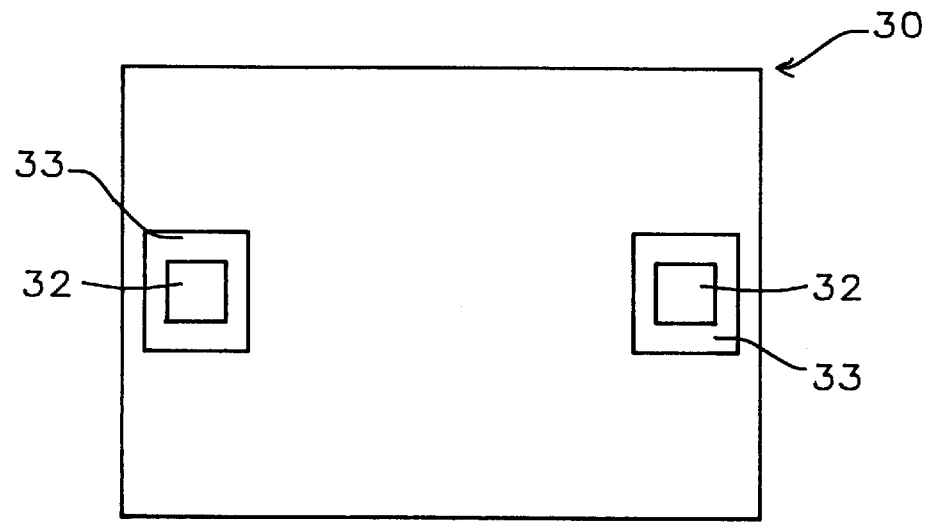
*FIG. 2A – Prior Art*
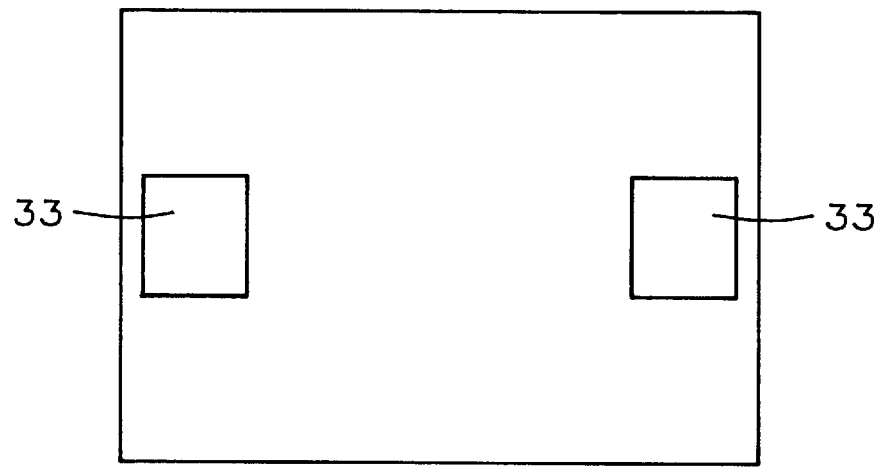
*FIG. 2B – Prior Art*

METHOD FOR RECOVERING ALIGNMENT MARKS AFTER CHEMICAL MECHANICAL POLISHING

BACKGROUND OF THE INVENTION (1) Field of the Invention

This invention relates to a mask and method of recovering alignment marks after forming a metal layer on a wafer planarized using chemical mechanical polishing. More particularly the invention relates to dividing a pattern formed on an extra mask and placing the pattern into the end regions of a mask used to pattern the wafer active region.

(2) Description of the Related Art

U.S. Pat. No. 5,271,798 to Sandhu et al. describes a method and apparatus for removing material from alignment marks using local etching. In this method the etchant is confined to the region of the wafer where the alignment marks are located.

U.S. Pat. No. 4,768,883 to Waldo et al. describes an alignment reticle for improving the accuracy of alignment and reducing alignment errors. The invention does not deal with methods of recovering alignment marks obscured by wafer processing steps.

This invention describes a mask pattern and method for recovering alignment marks obscured by wafer process steps which does not require the use of additional reticles. The pattern conventionally placed on separate reticles is divided into two parts and placed in the end regions of the mask used to pattern the active region of the wafer.

SUMMARY OF THE INVENTION

The manufacture of integrated circuit wafers requires a number of serial photolithographic steps which must be aligned to the same reference point. Alignment marks formed in the wafer usually serve this purpose. FIG. 1 shows a wafer 10 having an active region 14 and two alignment regions 12. Alignment marks are formed within the alignment regions. One of the problems encountered using alignment marks formed in the wafer is that these marks can become covered during process steps, such as planarization of an inter-level dielectric layer followed by formation of a metal conductor layer, so they can no longer be seen and thus can no longer serve as alignment marks.

When an inter-level dielectric layer covers the alignment marks and is planarized, such as by using chemical mechanical polishing, the alignment marks can still be seen through the inter-level dielectric layer. If the planarized inter-level dielectric layer is then covered with a layer of metal the alignment marks can no longer be seen through the reflective and opaque layer of metal. Some means must be used to recover the alignment marks in order to continue processing the wafer.

One method for recovering the alignment marks is to make use of a first reticle, shown in FIG. 2A, having opaque squares 32 surrounded by transparent windows 33 and a second reticle, shown in FIG. 2B, having transparent windows. The first reticle, having opaque squares 32 surrounded by transparent windows 33, is used to form a photoresist mask over the alignment marks so that the alignment marks can be recovered. The second reticle, having transparent windows 33, is used to remove inter-level dielectric from the alignment region.

The reticle s shown in FIGS. 2A and 2B can be used along with the mask, see FIG. 3A, used to pattern the active region of the wafer to recover the alignment marks but requires a the manufacture and use of separate reticles. The mask 20 used to the pattern the wafer, shown in FIG. 3A, has a device region 22, a first end region 24, and a second end region.

It is a principle objective of this invention to provide a pattern formed in the end regions of the mask used to pattern an integrated circuit wafer which can be used to recover the alignment marks after inter-level dielectric formation, inter-level dielectric planarization, and formation of a metal layer without the use of separate reticles.

It is another principle objective of this invention to provide a method for recovering the alignment marks after inter-level dielectric formation, inter-level dielectric planarization, and formation of a metal layer using a pattern formed in the end regions of the mask used to pattern an integrated circuit wafer without the use of separate reticles.

These objectives are achieved by dividing the opaque regions 32 surrounded by transparent windows 33, see FIG. 2A, into two sections and placing these two sections side by side in one of the end regions of the mask and by dividing the transparent windows 33, see FIG. 2B, and placing one half of the transparent window in the other end region of the mask. These sections of the opaque region surrounded by a transparent window formed in one end region of the mask are used to form a photoresist mask over the alignment marks so that the alignment marks can be recovered. The section of the transparent window formed in the other end region of the mask is used to remove inter-level dielectric from the alignment region of the wafer for recovery of the alignment marks.

BRIEF DESCRIPTION OF THE DRAWINGS

FIGS. 2A and 2B show a top views of reticles used in a conventional method of recovering the alignment marks.

DESCRIPTION OF THE PREFERRED EMBODIMENTS

Figure 1:
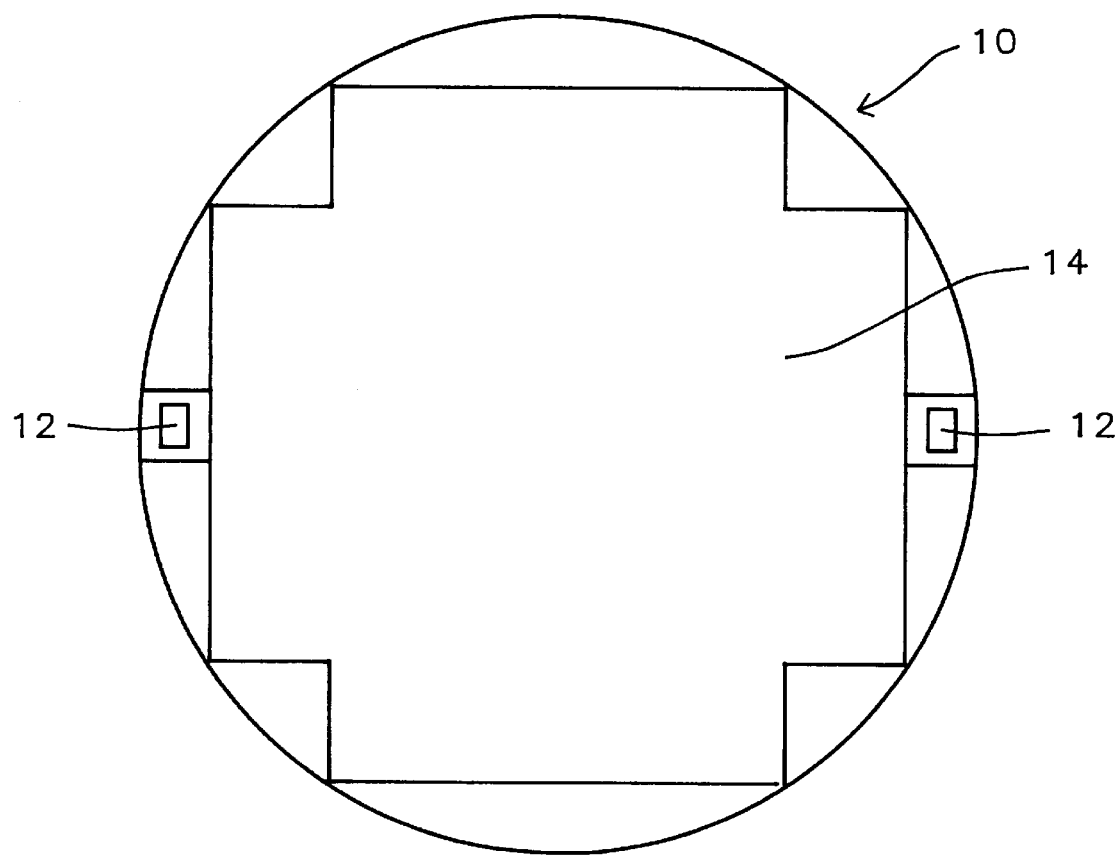
FIG. 1 shows a top view of an integrated circuit wafer having an active region and an alignment region.
Figure 3A:
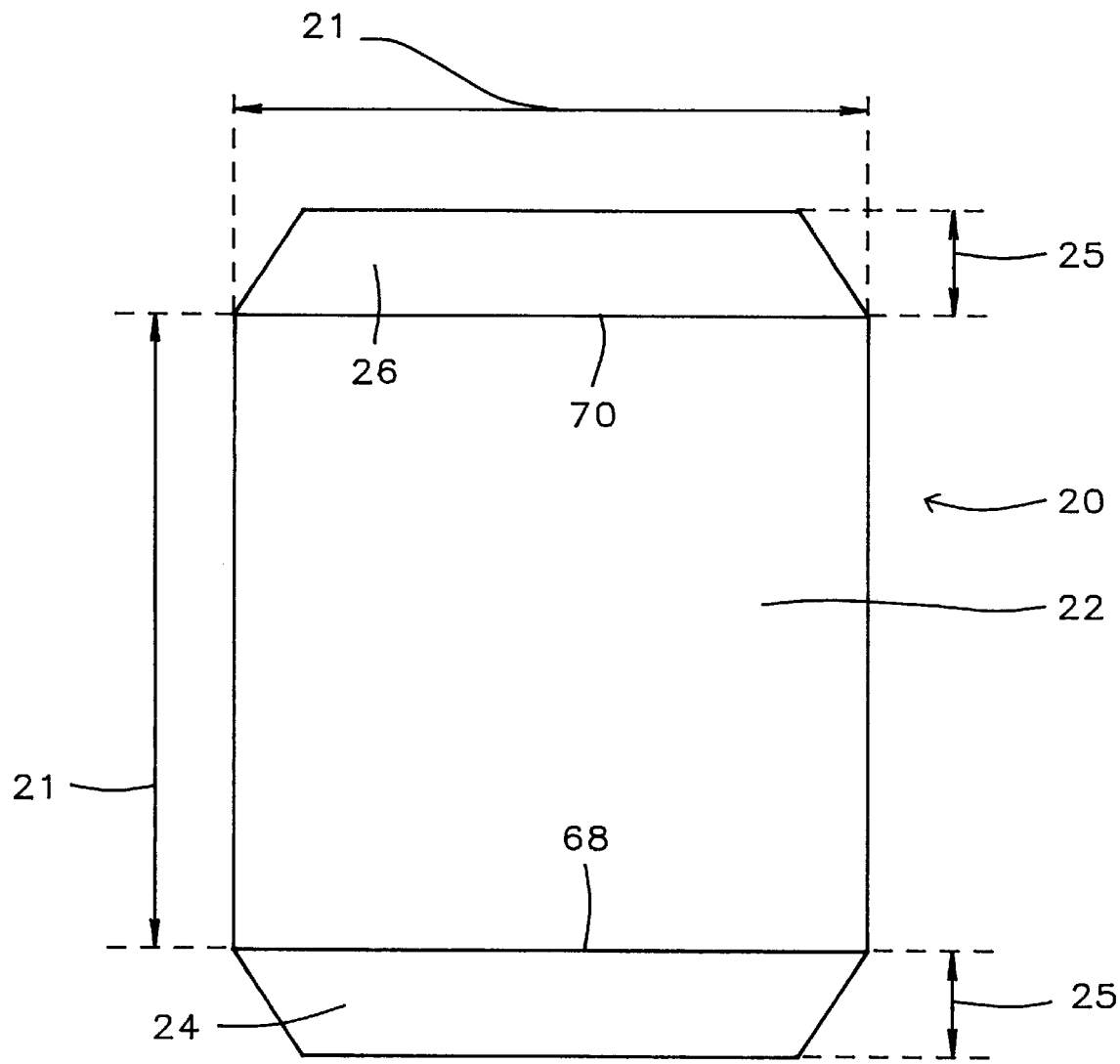
FIG. 3A shows a top view of a mask used to expose a layer of photoresist formed on the wafer to form a photoresist mask.

The mask having a pattern for recovering alignment marks in an integrated circuit wafer will now be described with reference to FIGS. 1–5. FIG. 1 shows a top view of an integrated circuit wafer 10 having an active region 14 and alignment regions 12, in this example two alignment regions are shown. The alignment marks are formed within the alignment region. A mask 20 used in the photolithographic processing of the wafer is shown in FIG. 3A. The mask 20 has a device region 22, a first end region 24, and a second end region 26. In this example the device region 22 is square having sides 21 between about 18 and 26 millimeters long. A first end region 24 and a second end region 26 extend from a first end 68 and a second end 70 of the device region 22. In this example both the first end region 24 and the second end region 26 have a width 25 of between about 2.2 and 3.2 millimeters.

Figure 3B:
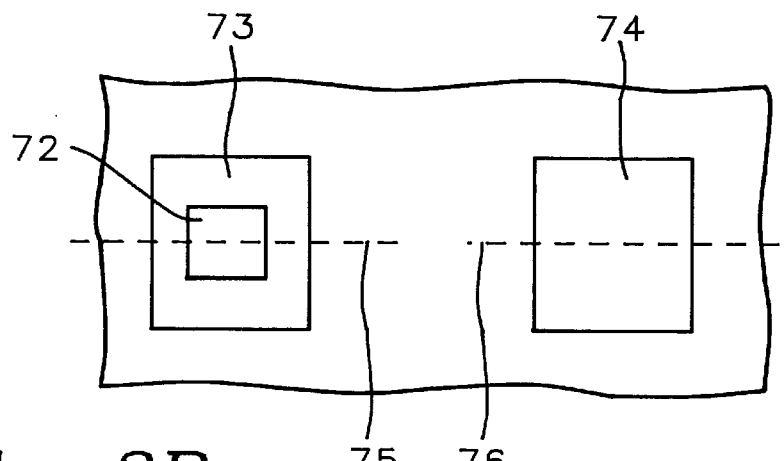
FIG. 3B shows a top view of the opaque region surrounded by a transparent window and the transparent window which must be reproduced by the mask of this invention.

To recover the alignment marks without the use of extra reticles patterns are formed in the first end region 24, the second end region 26, or both the first end region 24 and the second end region 26 of the mask 20. The required patterns, shown in FIG. 3B, are an opaque region 72 formed within a transparent window 73 and a transparent window 74 having no opaque regions. In this example the transparent windows 73 and 73, both with and without the opaque region 72, are squares having sides of between about 3.0 and 4.2 millimeters long and the opaque region 72 is a square having sides of between about 1.2 and 2.0 millimeters long. In order to fit the required patterns into the first end region 24 and/or the second end region 26 the pattern must be divided into segments.

Figure 4A:
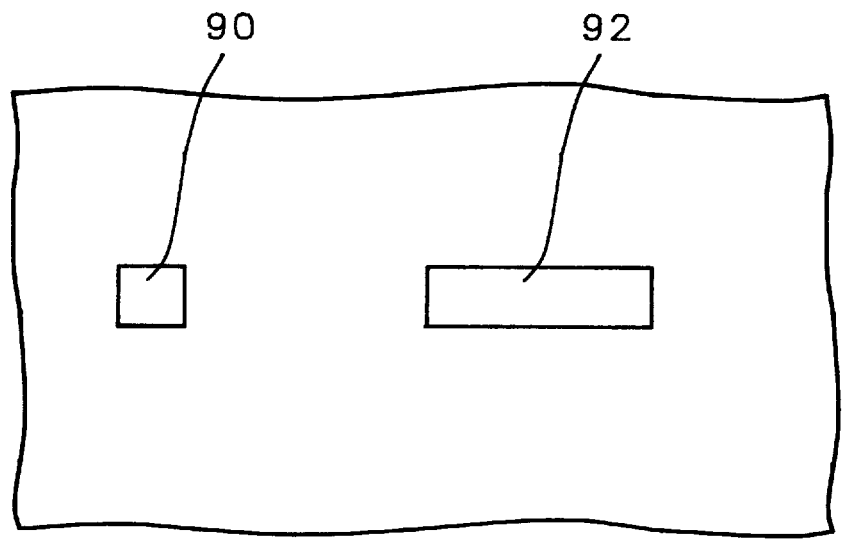
FIG. 4A shows mask segments which are used to form a mask for recovering alignment marks.

One embodiment of mask pattern segments used to form the required mask pattern is shown in FIGS. 4A–4D. FIG. 4A shows a first mask pattern segment 90 used to form the opaque region, 72 in FIG. 3B, within the transparent window, 73 in FIG. 3B. FIG. 4A also shows a second mask pattern segment 92 used to form the transparent window, 73 in FIG. 3B, surrounding the opaque region, 72 in FIG. 3B, and the transparent window, 74 in FIG. 3B, of the mask used to recover the alignment mark.

Figure 4B:
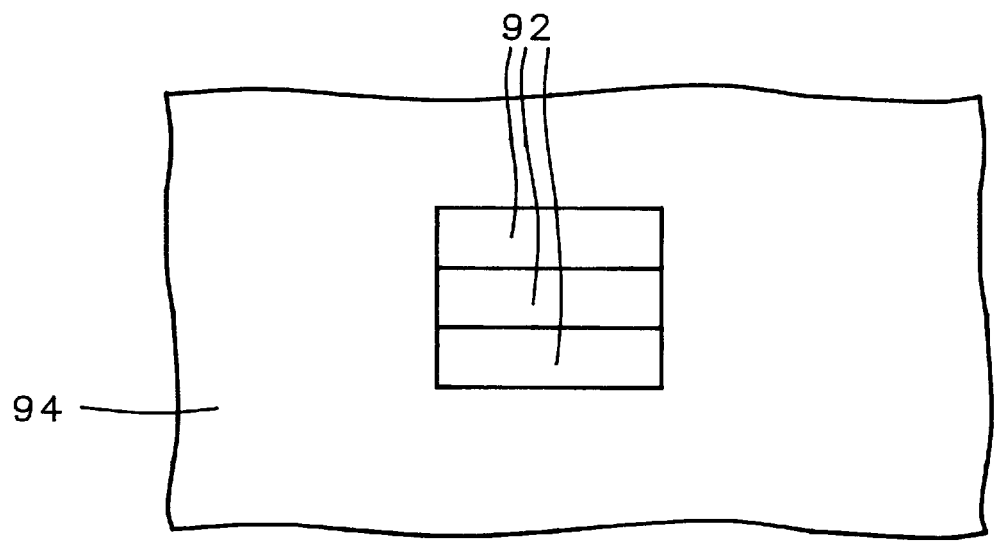
FIG. 4B shows the mask segments of FIG. 4A arranged to form the transparent window of the mask used to recover alignment marks.
Figure 4C:
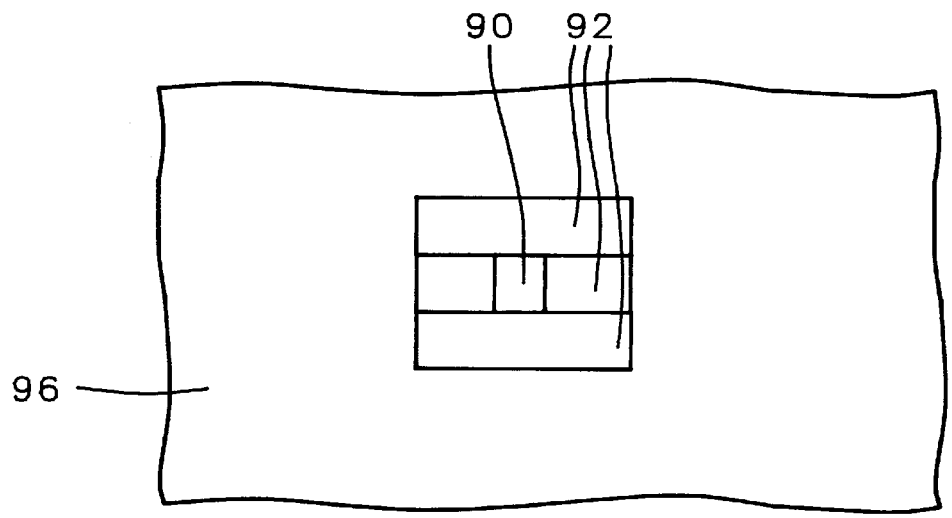
FIG. 4C shows the mask segments of FIG. 4A arranged to form the opaque region surrounded by a transparent window used to recover alignment marks.
Figure 4D:
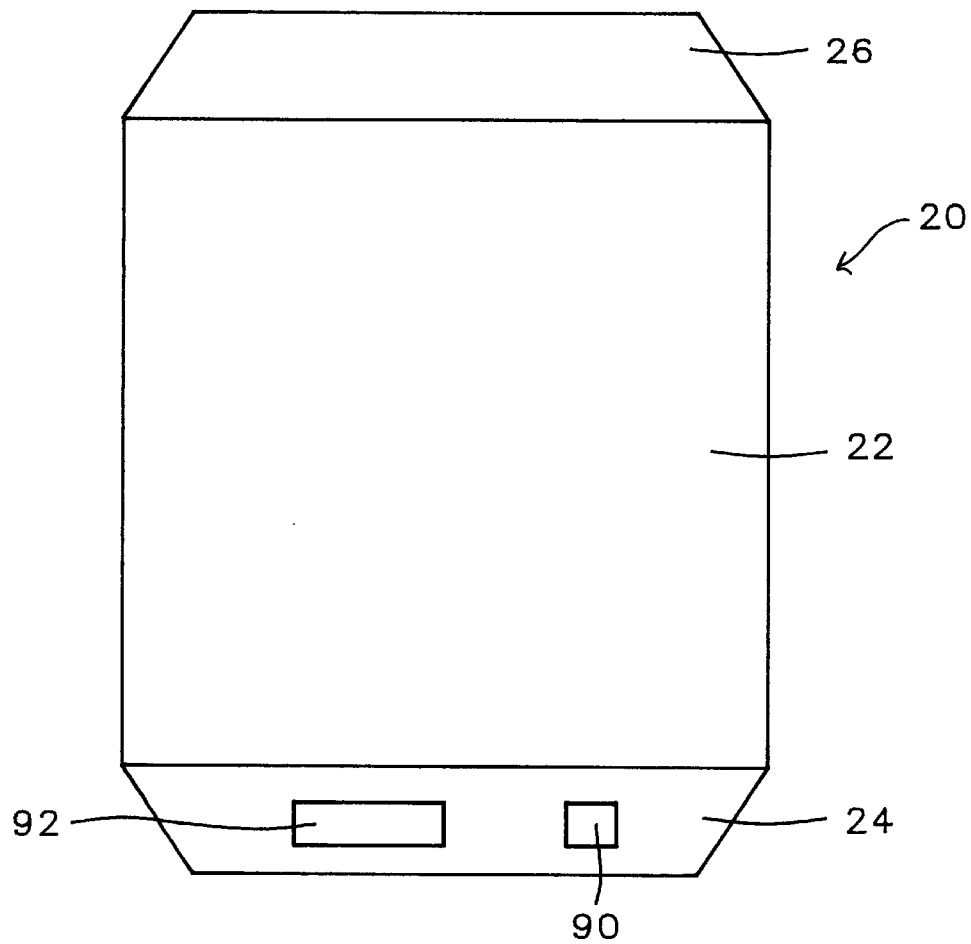
FIG. 4D shows the mask segments of FIG. 4A formed in one of the end regions of a mask used to expose a layer of photoresist on a wafer.

As shown in FIG. 4B the second mask pattern segment 92 can be arranged to for the transparent window. As shown in FIG. 4C the first mask pattern segment 90 can be used to form the opaque region within the transparent window. FIG. 4D shows how the first mask segment 90 and the second mask segment 92 can be placed in the first end region 24 at one end of the active region 22 of the mask 20. The first mask segment 90 and second mask segment 92 could also be placed in the second end region 26 of the mask.

Figure 5:
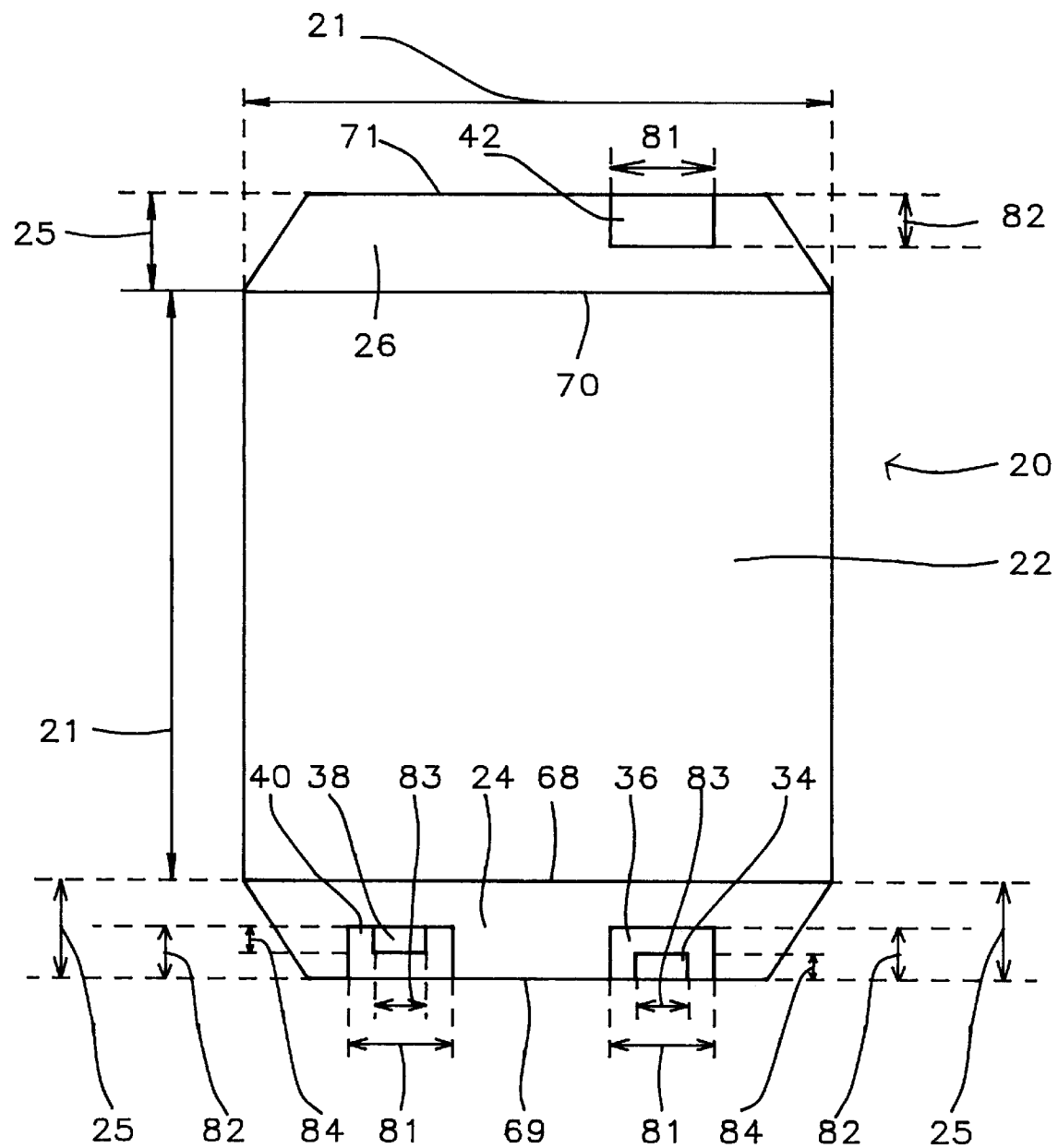
FIG. 5 shows a top view of the mask of this invention used to expose a layer of photoresist formed on the wafer to form a photoresist mask, having patterns formed in the end regions to recover the alignment marks.
Figure 6A:
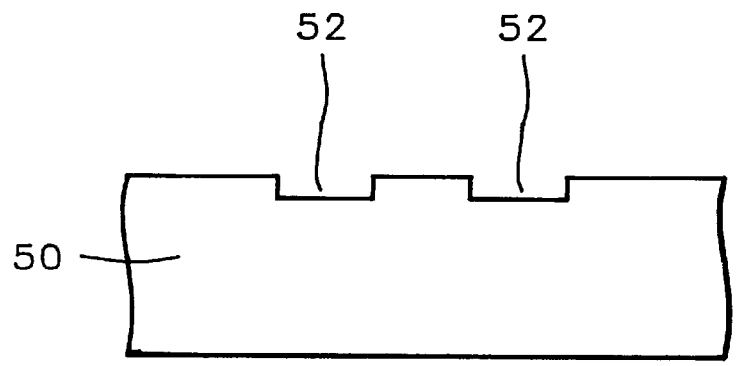
FIGS. 6A and 6B show cross section views of the alignment region and the active region of the wafer after formation of the alignment marks.
Figure 6B:
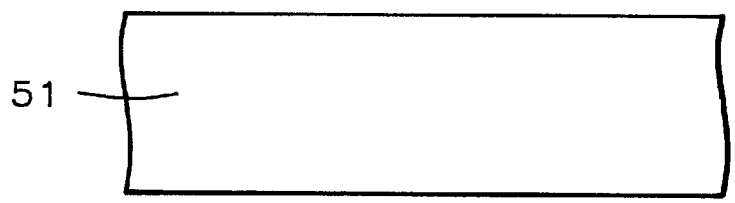
Figure 7A:
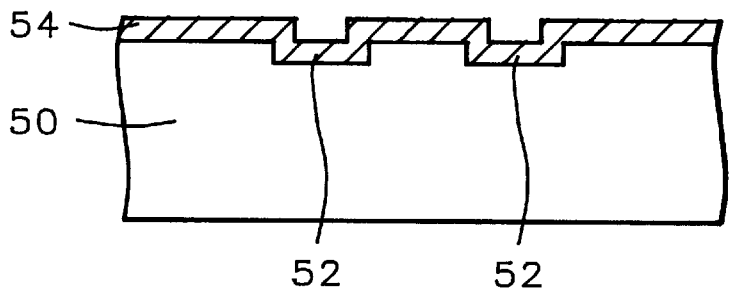
FIGS. 7A and 7B show cross section views of the alignment region and the active region of the wafer after formation of a first conductor layer
Figure 7B:
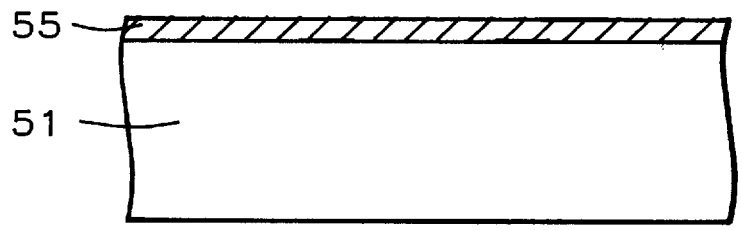

Another embodiment of mask segments used to fit the required patterns into the first end region 24 and the second end region 26 of the mask 20 with the pattern divided into two pieces is shown in FIGS. 3B and 5. The opaque region 72 within a transparent window 73 is divided at line 75, see FIG. 3B, and placed in the first end region 24 of the mask, see FIG. 5. The transparent window 74 with no opaque region is divided along line 76, see FIG. 3B, and one half of the transparent window is placed in the second end region 26 of the mask, see FIG. 5.

Refer now to FIG. 5 for a top view of the mask with patterns in the end regions to recover alignment marks. The mask has a device region 22, a first end region 24, and a second end region 26. The device region 22 has a first end 68 and a second end 70. The first end region 24 is adjacent to the first end 68 of the device region 22 and the second end region 26 is adjacent to the second end 70 of the device region. In this example the device region 22 is a square having sides 21 between about 18 and 26 millimeters long. The first end region 24 and the second end region 26 have a width of between about 2.2 and 3.2 millimeters.

A first opaque region 34 formed within a first transparent window 36 is formed within the first end region 24. In this example the first opaque region 34 is a rectangle having a length 83 of between about 1.2 and 2.0 millimeters and a width 84 of between about 0.6 and 1.0 millimeters. The first transparent window 36 is also a rectangle in this example having a length 81 of between about 3.0 and 4.2 millimeters and a width 82 of between about 1.5 and 2.1 millimeters. One of the longer sides of the first opaque region 34 lies on the same line as one of the longer sides of the first transparent window 36 and the outer edge 69 of the first end region 24. The midpoint of the side of the first opaque region 34 which is co-linear with one of the sides of first transparent window 36 is at the midpoint of that side of the first transparent window.

A second opaque region 38 formed within a second transparent window 40 is formed within the first end region 24. In this example the second opaque region 38 is a rectangle having a length 83 of between about 1.2 and 2.0 millimeters and a width 84 of between about 0.6 and 1.0 millimeters. The second transparent window 40 is also a rectangle in this example having a length 81 of between about 3.0 and 4.2 millimeters and a width 82 of between about 1.5 and 2.1 millimeters. One of the longer sides of the second opaque region 38 lies on the same line as one of the longer sides of the second transparent window 40 and the midpoints of these two sides are coincident. The other longer side of the second transparent window 40 and the outer edge 69 of the first end region 24 lie on the same line.

A third transparent window 42 is formed within the second end region 26. In this example the third transparent window 42 is a rectangle having a length 81 of between about 3.0 and 4.2 millimeters and a width 82 of between about 1.5 and 2.1 millimeters. One of the longer sides of the third transparent window 42 lies on the same line as the outer edge 71 of the second end region 26.

Refer now to FIGS. 5–14B for a description of the preferred embodiment of a method of using the mask described in the preceding embodiment and shown in FIG. 5 to recover alignment marks. FIG. 6A shows an alignment region 50 and FIG. 6B part of the active region 51 of an integrated circuit wafer. Alignment marks 52 are formed in the wafer in the alignment region, see FIG. 6A. FIG. 7A shows the alignment region 51 and FIG. 7B the active region 51 after a first conductor layer 54 and 55 has been formed on the integrated circuit wafer. The alignment marks 52 are still visible in the alignment region, see FIG. 7A. The first conductor layer in this example is polysilicon having a thickness of between about 2500 and 3500 Angstroms.

Figure 8A:
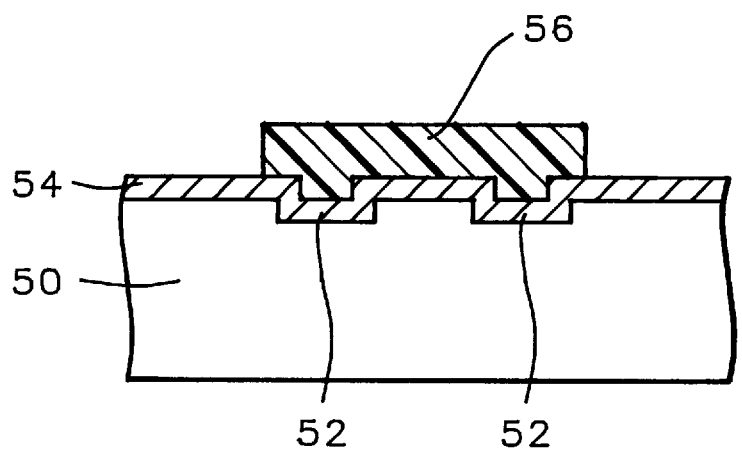
FIGS. 8A and 8B show cross section views of the alignment region and the active region of the wafer after patterning a first layer of photoresist.
Figure 8B:
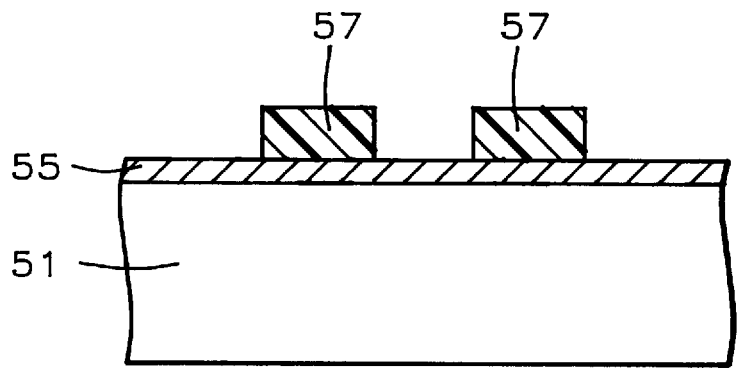
Figure 9A:
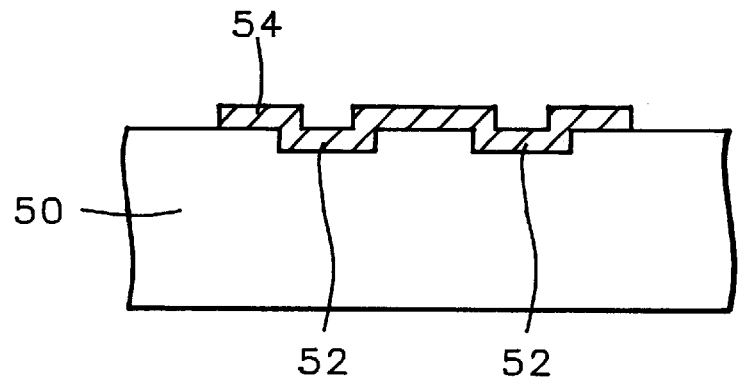
FIGS. 9A and 9B show cross section views of the alignment region and the active region of the wafer after etching the first conductor layer and removing the first layer of photoresist.
Figure 9B:
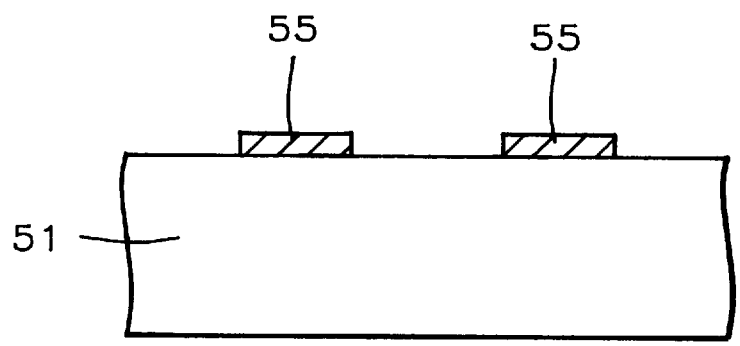

A first layer of photoresist is then formed over the first conductor layer and patterned. FIG. 8A shows the alignment region where the photoresist pattern 56 has been formed by using patterns formed in the first end region 24 of the mask shown in FIG. 5 and described in the previous embodiment. The photoresist in the alignment region is exposed in two steps first using the first opaque region 34 formed in the first transparent window 36 followed by using the second opaque region 38 formed in the second transparent window 40. The device region of the mask 22 is used to expose the active region of the wafer to form the photoresist pattern shown in FIG. 8B. The first conductor layer is then etched and the photoresist mask stripped. FIG. 9A shows the alignment region of the wafer with a first conductor pattern 54 over the alignment marks. FIG. 9B shows the active region of the wafer with a patterned conductor layer 55 over the active region. As can be seen in FIG. 9A the alignment marks 52 are still visible.

Figure 10A:
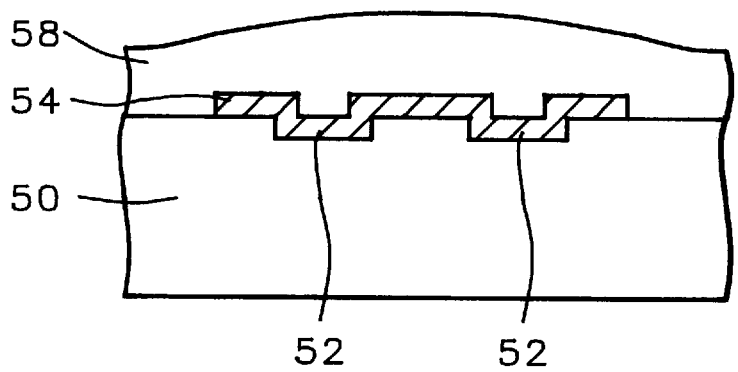
FIGS. 10A and 10B show cross section views of the alignment region and the active region of the wafer formation of an inter-level dielectric layer.
Figure 10B:
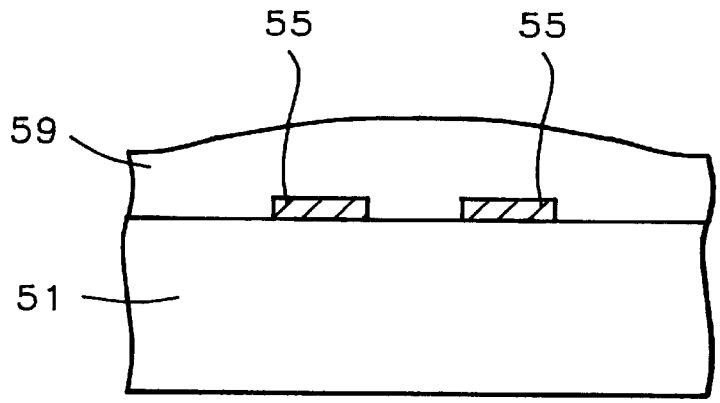
Figure 11A:
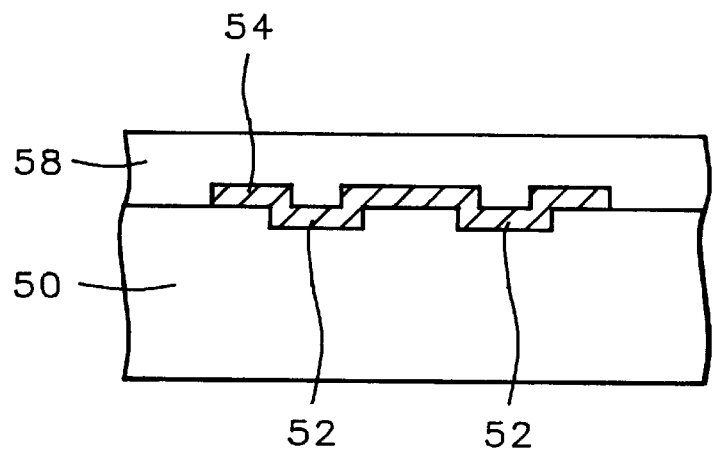
FIGS. 11A and 11B show cross section views of the alignment region and the active region of the wafer after planarizing the inter-level dielectric layer.
Figure 11B:
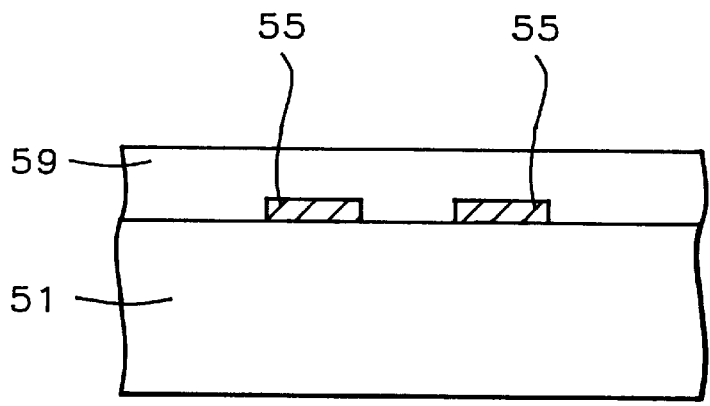

Next an inter-level dielectric layer, such as silicon dioxide having a thickness of between about 12 and 16 Angstroms is formed over the wafer. FIG. 10A shows the inter-level dielectric 58 layer over the alignment region and FIG. 10B shows the inter-level dielectric layer over the active region of the wafer. The inter-level dielectric layer is then planarized. In this example the wafer is planarized using chemical mechanical polishing so that the thickness of the inter-level dielectric is between about 8000 and 12000 Angstroms. FIG. 11A shows the alignment region and FIG. 11B shows the active region of the wafer after planarization. As can be seen in FIG. 11A the alignment marks can still be detected through the inter-level dielectric 58.

Figure 12A:
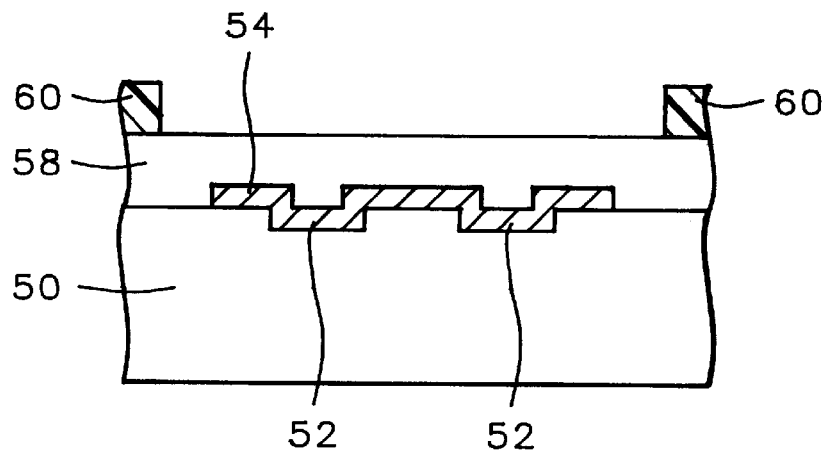
FIGS. 12A and 12B show cross section views of the alignment region and the active region of the wafer after patterning a second layer of photoresist.
Figure 12B:
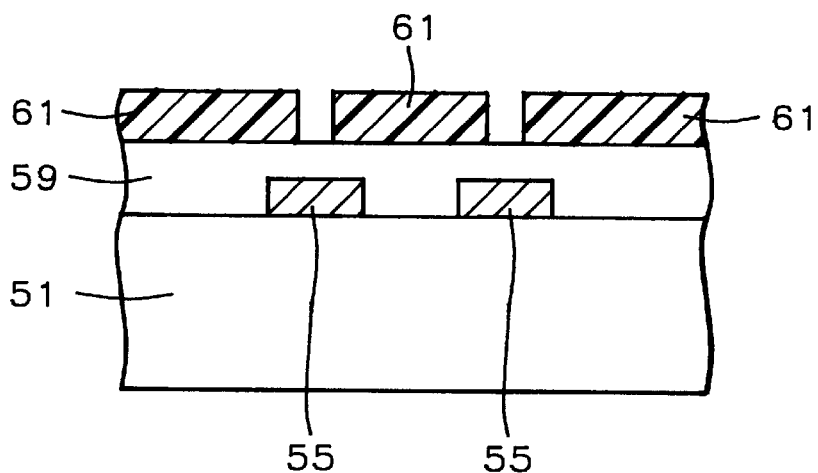
Figure 13A:
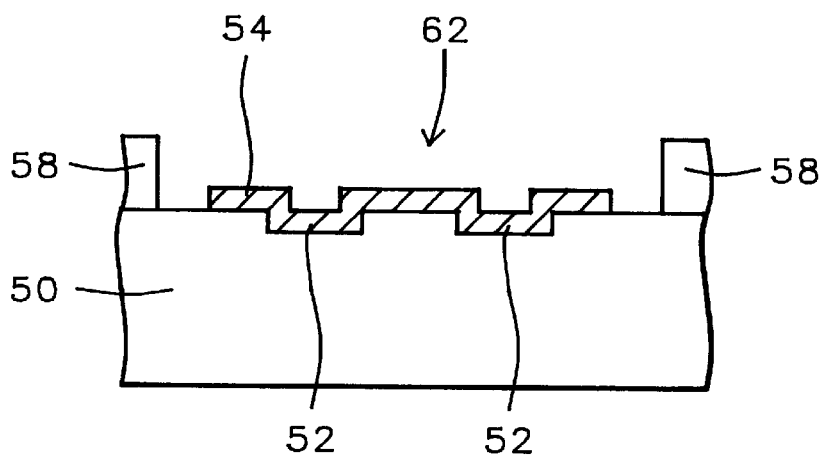
FIGS. 13A and 13B show cross section views of the alignment region and the active region of the wafer after etching the inter-level dielectric layer.
Figure 13B:
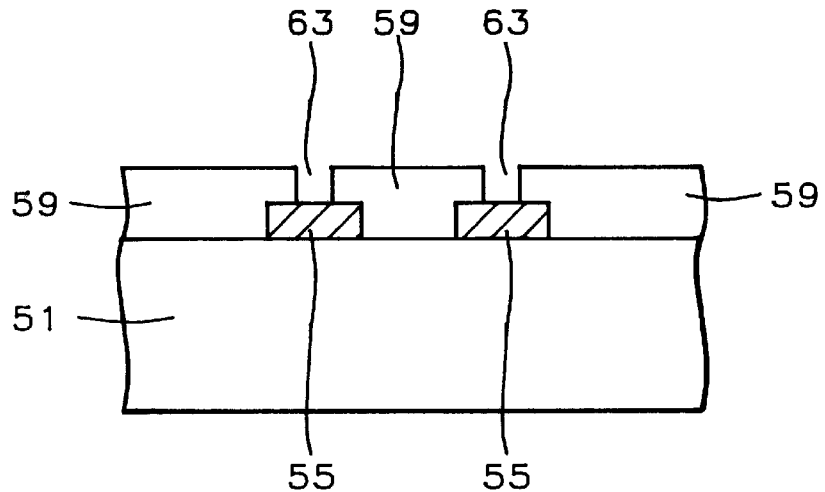

Next a second layer of photoresist is formed on the wafer and patterned. As shown in FIG. 12A, the second layer of photoresist over the alignment region is patterned to form a photoresist mask 60 having an opening over the first conductor pattern 54 formed over the alignment marks 52. This photoresist mask 60 is formed using the third transparent window 42 formed in the second end region 26 of the mask, see FIG. 5. To form this pattern the photoresist is again exposed in two steps. As shown in FIG. 12B the photoresist over the active region of the wafer is exposed to form a photoresist mask 61 having contact holes using the device region of the mask 22, see FIG. 5. That part of the inter-level dielectric not protected by photoresist is then etched away forming a clear out region 62 in the alignment region of the wafer, see FIG. 13A and contact holes 63 in the active region of the wafer, see FIG. 13B.

Figure 14A:
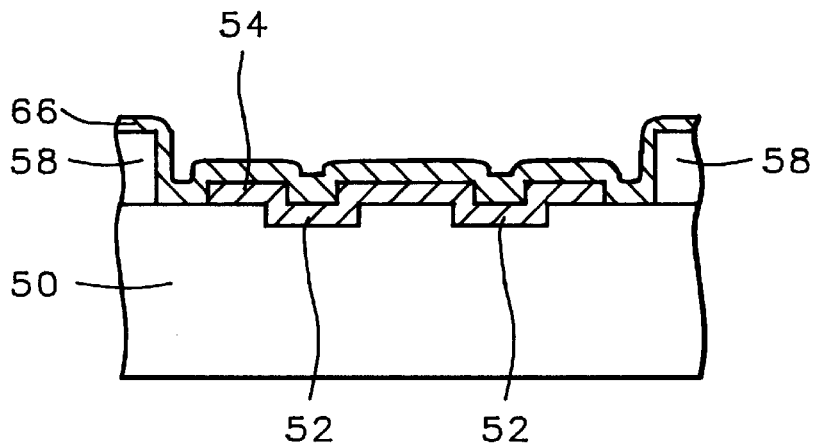
FIGS. 14A and 14B show cross section views of the alignment region and the active region of the wafer after forming a second conductor layer.
Figure 14B:
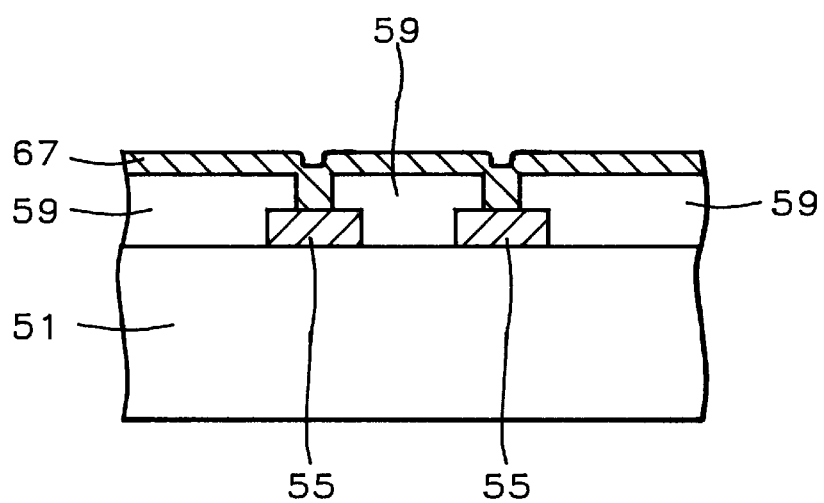

Next a second conductor layer is formed over the integrated circuit wafer. FIG. 14A shows the second conductor layer 66 formed in the alignment region of the wafer. FIG. 14B shows the second conductor layer 67 formed over the active region of the wafer filling the contact holes. In this example the second conductor layer comprises Al-Cu having a thickness of between about 3000 and 5000 Angstroms and TiN having a thickness of between about 1200 and 1600 Angstroms. As can be seen in FIG. 14A the alignment marks 52 are still visible and can be used for subsequent processing steps. This method and mask has recovered the alignment marks after planarization of an inter-metal dielectric followed by formation of a metal layer over the planarized dielectric.

While the invention has been particularly shown and described with reference to the preferred embodiments thereof, it will be understood by those skilled in the art that various changes in form and details may be made without departing from the spirit and scope of the invention.

What is claimed is:

1. A method of recovering alignment marks, comprising the steps of:

providing a mask having a device region, a first end region, and a second end region;

providing a first pattern in said first end region of said mask wherein said first pattern comprises a first transparent window and a first opaque region formed in said first transparent window;

providing a second pattern in said first end region of said mask wherein said second pattern comprises a second transparent window and a second opaque region formed in said second transparent window;

providing a third pattern in said second end region of said mask wherein said third pattern comprises a third transparent window;

providing an integrated circuit wafer having an active region and one or more alignment regions with alignment marks formed in said alignment regions;

forming a first conductor layer on said integrated circuit wafer;

forming a first layer of photoresist on said first conductor layer;

patterning said first layer of photoresist thereby forming a first active region photoresist mask over said active region of said integrated circuit wafer and a first alignment region photoresist mask over said alignment regions of said integrated circuit wafer wherein said first alignment region photoresist mask comprises photoresist directly over said alignment marks and is formed using said first pattern in said first end region of said mask and said second pattern in said first end region of said mask;

etching away that part of said first conductor layer not covered by said first alignment region photoresist mask and said first active region photoresist mask;

removing said first alignment region photoresist mask and said first active region photoresist mask after etching said first conductor layer;

forming a layer of inter-level dielectric over said integrated circuit wafer after removing said first alignment region photoresist mask and said first active region photoresist mask;

planarizing said layer of inter-level dielectric;

forming a second layer of photoresist over said planarized layer of inter-level dielectric;

patterning said second layer of photoresist thereby forming a second active region photoresist mask over said active region of said integrated circuit wafer and a second alignment region photoresist mask over said alignment regions of said integrated circuit wafer wherein said second alignment region photoresist mask has no photoresist directly over said alignment marks and is formed using said third pattern in said second end region of said mask;

etching that part of said planarized layer of inter-level dielectric not covered by said second active region photoresist mask and said second alignment region photoresist mask;

removing said second active region photoresist mask and said second alignment region dielectric mask after etching said planarized layer of inter-level dielectric;

forming a second conductor layer on said integrated circuit wafer after removing said second active region photoresist mask and said second alignment region photoresist mask; and patterning said second conductor layer.

2. The method of claim 1 wherein said first transparent window is a rectangle having a length and a width wherein said length is between about 3.0 and 4.2 millimeters and said width is between about 1.5 and 2.1 millimeters.

3. The method of claim 1 wherein said second transparent window is a rectangle having a length and a width wherein said length is between about 3.0 and 4.2 millimeters and said width is between about 1.5 and 2.1 millimeters.

4. The method of claim 1 wherein said third transparent window is a rectangle having a length and a width wherein said length is between about 3.0 and 4.2 millimeters and said width is between about 1.5 and 2.1 millimeters.

5. The method of claim 1 wherein said first opaque region is a rectangle having a length and a width wherein said length is between about 1.2 and 2.0 millimeters and said width is between about 0.6 and 1.0 millimeters.

6. The method of claim 1 wherein said second opaque region is a rectangle having a length and a width wherein said length is between about 1.2 and 2.0 millimeters and said width is between about 0.6 and 1.0 millimeters.

7. The method of claim 1 wherein said first conductor layer is polysilicon having a thickness of between about 2500 and 3500 Angstroms.

8. The method of claim 1 wherein said second conductor layer comprises Al-Cu having a thickness of between about 3000 and 5000 Angstroms and TiN having a thickness of between about 1200 and 1600 Angstroms.

9. The method of claim 1 wherein said inter-level dielectric layer is planarized using chemical mechanical polishing.

* * * * *